(12) United States Patent
Pramanik et al.

(10) Patent No.: US 9,177,996 B2
(45) Date of Patent: Nov. 3, 2015

(54) METHOD FOR FORMING RERAM CHIPS OPERATING AT LOW OPERATING TEMPERATURES

(71) Applicant: Intermolecular, Inc., San Jose, CA (US)

(72) Inventors: Dipankar Pramanik, Saratoga, CA (US); Tony P. Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 57 days.

(21) Appl. No.: 14/072,611

(22) Filed: Nov. 5, 2013

(65) Prior Publication Data

US 2014/0273300 A1    Sep. 18, 2014

Related U.S. Application Data

(60) Provisional application No. 61/785,069, filed on Mar. 14, 2013.

(51) Int. Cl.
*H01L 27/24* (2006.01)
*H01L 45/00* (2006.01)
(Continued)

(52) U.S. Cl.
CPC ........ *H01L 27/2418* (2013.01); *G11C 13/0002* (2013.01); *G11C 13/0007* (2013.01); *G11C 13/0069* (2013.01); *H01L 21/0228* (2013.01); *H01L 21/0234* (2013.01); *H01L 21/02183* (2013.01); *H01L 21/02186* (2013.01); *H01L 21/283* (2013.01); *H01L 21/324* (2013.01); *H01L 22/12* (2013.01); *H01L 22/34* (2013.01); *H01L 27/24* (2013.01); *H01L 28/60* (2013.01); *H01L 45/08* (2013.01); *H01L 45/12* (2013.01); *H01L 45/1233* (2013.01); *H01L 45/1253* (2013.01); *H01L 45/1266* (2013.01); *H01L 45/14* (2013.01); *H01L 45/144* (2013.01); *H01L 45/145* (2013.01); *H01L 45/16* (2013.01); *H01L 45/1608* (2013.01); *H01L 45/1616* (2013.01); *H01L 45/1641* (2013.01); *G11C 2013/0083* (2013.01); *G11C 2213/15* (2013.01); *G11C 2213/71* (2013.01); *G11C 2213/77* (2013.01);
(Continued)

(58) Field of Classification Search
CPC ......... H01L 22/30; H01L 22/34; H01L 27/24; H01L 27/2463; H01L 45/04; H01L 45/14; H01L 45/146; H01L 45/16; H01L 45/1608; H01L 45/1641
USPC ......... 438/3, 84; 365/148, 163, 211, 158, 174
See application file for complete search history.

(56) References Cited

U.S. PATENT DOCUMENTS

| | | | |
|---|---|---|---|
| 7,259,387 | B2 | 8/2007 | Kawazoe et al. |
| 2005/0153504 | A1 | 7/2005 | Kawazoe et al. |
| 2011/0110158 | A1* | 5/2011 | Schuette ................. 365/185.17 |

OTHER PUBLICATIONS

Jung et al, "Resistive Switching Characteristics of Solution-processed Transparent TiOx for Nonvolatile Memory Application" Journal of the Electrochemical Society, 157 (11) H1042-H1045 (2010).*

(Continued)

*Primary Examiner* — Thanhha Pham

(57) ABSTRACT

Forming a resistive memory structure at a temperature well above the operating temperature can reduce the forming voltage and create a defect distribution with higher stability and lower programming voltages. The forming temperature can be up to 200 C above the operating temperature. The memory chip can include an embedded heater in the chip package, allowing for a chip forming process after packaging.

15 Claims, 12 Drawing Sheets

(51) Int. Cl.
  *H01L 21/66* (2006.01)
  *G11C 13/00* (2006.01)
  *H01L 21/02* (2006.01)
  *H01L 21/283* (2006.01)
  *H01L 21/324* (2006.01)
  *H01L 49/02* (2006.01)

(52) U.S. Cl.
  CPC ..... *H01L 27/2463* (2013.01); *H01L 2924/0002* (2013.01)

(56) References Cited

OTHER PUBLICATIONS

Chen; Current Overshoot During Set and Reset Operations of Resistive Switching Memories; 2012; IEEE; pp. MY.2.1-MY.2.4.
Li et al.; Reset Instability in Cu/ZrO2:Cu/Pt RRAM Device; Mar. 2011; IEEE; IEEE Electron Device Letters, vol. 32, No. 3; pp. 363-365.
Nardi et al.; Reset Current Reduction and Set-Reset Instabilities in Unipolar NiO RRAM; 2011; IEEE; 4 pages.

* cited by examiner

Initial Forming

Operational Switching

METHOD FOR FORMING RERAM CHIPS OPERATING AT LOW OPERATING TEMPERATURES

This application claims priority to U.S. Provisional Patent Application No. 61/785,069 entitled "ReRAM Materials" filed on Mar. 14, 2013, which is incorporated herein by reference.

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states can be insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Therefore, there is a need for a memory device that can meet the design criteria for advanced memory devices.

SUMMARY

In some embodiments, methods and devices for forming resistive memory devices are provided. After fabricating the memory structures, which can include an insulator layer disposed between two electrodes, the memory structure can be heated while applying a voltage to form a switching layer from the insulator layer. The thermal energy, e.g., the energy from the heating process, can assist in reducing the forming voltage, which can lead to a reduction in power consumption. In addition, the thermal energy can improve the retention of the switching layer, by overcoming a higher barrier in the process of converting the insulator layer to the switching layer, as compared to a forming process without the added thermal energy.

In some embodiments, the temperature of the memory structure can be raised to a temperature well above the operating temperature. A forming voltage can then be applied to the memory structure to form the switching layer, for example, by forming defect filaments in the insulator layer. The high temperature of the switching layer forming process can reduce the forming voltage, or can create a defect distribution that allows for lower switching voltages or allows for higher stability or retention.

In some embodiments, the forming temperature can be 200 C higher than the operating temperature. Alternatively, the forming temperature can be less than 50 C higher, less than 100 C higher, or less than 150 C higher. The operating temperature of the memory structure can be less than about 85 C, such as between a room temperature of 20 C and 85 C, or between 50 C and 85 C. Thus the forming temperature can be between 50 C and 300 C, such as between 100 C and 250 C.

In some embodiments, the high temperature forming process can be performed at wafer level, e.g., before packaging. After the memory structures are fabricated, e.g., the electrodes and the insulator layer are deposited, on a semiconductor wafer, the memory structures can be heated and the switching layers are formed before the memory chip are packaged. For example, the wafer can be heated and forming voltage can be applied to the memory structures on the wafer. Afterward, the wafer can be diced and packaged to form the memory chip. Alternatively, the wafer can be diced into multiple pieces before heating and forming, and after packaging.

In some embodiments, the high temperature forming process can be performed at chip level, e.g., after packaging. After the memory structures are fabricated, e.g., the electrodes and the insulator layer are deposited, on a semiconductor wafer, the wafer is diced into individual memory arrays. The memory arrays are then encapsulated to form memory chips. Embedded heater in the memory chips can allow heating the memory chip while forming the switching layers.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
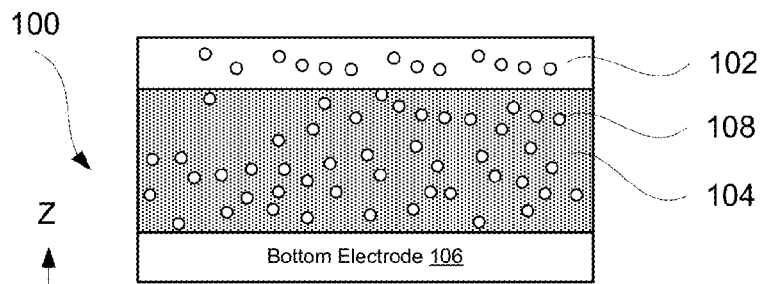
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and resistive memory devices are provided in which the resistive memory devices can be formed at a temperature well above the operating temperature. The high temperature formation process can reduce the forming voltage and create a defect distribution with higher stability and lower programming voltages. A memory chip incorporating the heated forming process can include an embedded heater in the chip package, allowing for a chip forming process after packaging.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
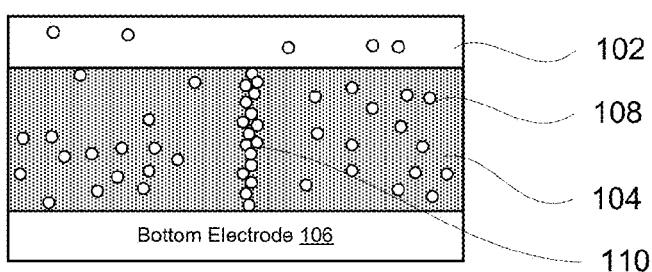
Figure 1C:
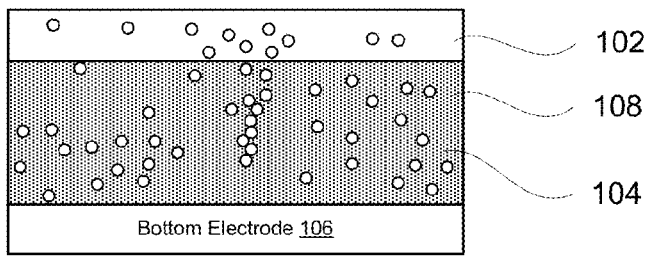

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices incorporating a ReRAM cell. As such, electrode 102 and 106 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types, all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2:
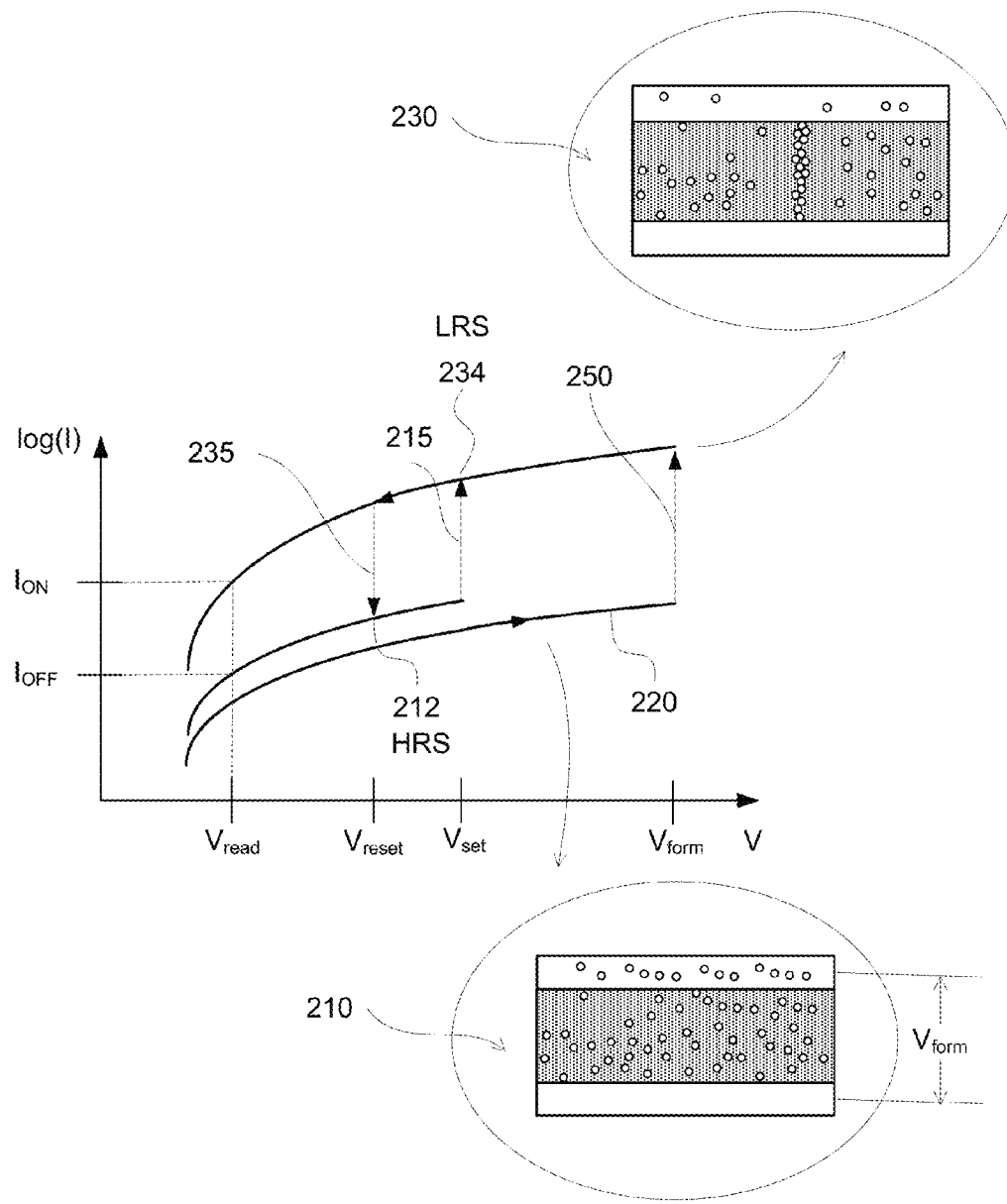
FIG. 2 illustrates a plot of a current passing through a unipolar ReRAM cell as a function of a voltage applied to the ReRAM cell, in accordance with some embodiments.

FIG. 2 illustrates a plot of a current passing through a unipolar ReRAM cell as a function of a voltage applied to the ReRAM cell according to some embodiments. A metal-insulator-metal (MIM) structure 210 can be first fabricated with an amount of defects embedded in the insulator layer. A voltage 220 can be applied to the MIM structure to form a resistive memory device from the MIM structure, for example, by making the insulator layer becoming a switching layer. By applying a forming voltage $V_{form}$, the randomly distributed defects can be transitioned 250 to lower resistance configurations, for example, in the form of filaments 230.

The lower resistance configurations can be characterized as a low resistance state (LRS) 234 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 235 to a high resistance state (HRS), which persists even when the voltage is reduced. The HRS can represent another logic state of the memory device, such as a logic one ("1"). The reset voltage $V_{reset}$ is smaller then the forming voltage $V_{form}$.

At HRS, when another voltage, e.g., $V_{set}$ is applied, the resistance can be transitioned 215 back to the low resistance state (LRS), which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer as described above with reference to FIG. 1B. If it is desired to turn "OFF" the ReRAM cell, e.g., to change to HRS, a reset operation can be preformed through the application of a reset voltage $V_{reset}$ to the electrodes. Applying the reset voltage can destroy the conductive paths in the resistance switching layer as described above with reference to FIG. 1C.

The polarity of the reset voltage and the set voltage may be the same in unipolar memory devices, or may be different in bipolar devices (not shown). Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm$^2$ measured at 0.5 V per 20 Å of oxide thickness in HRS.

Figure 3:
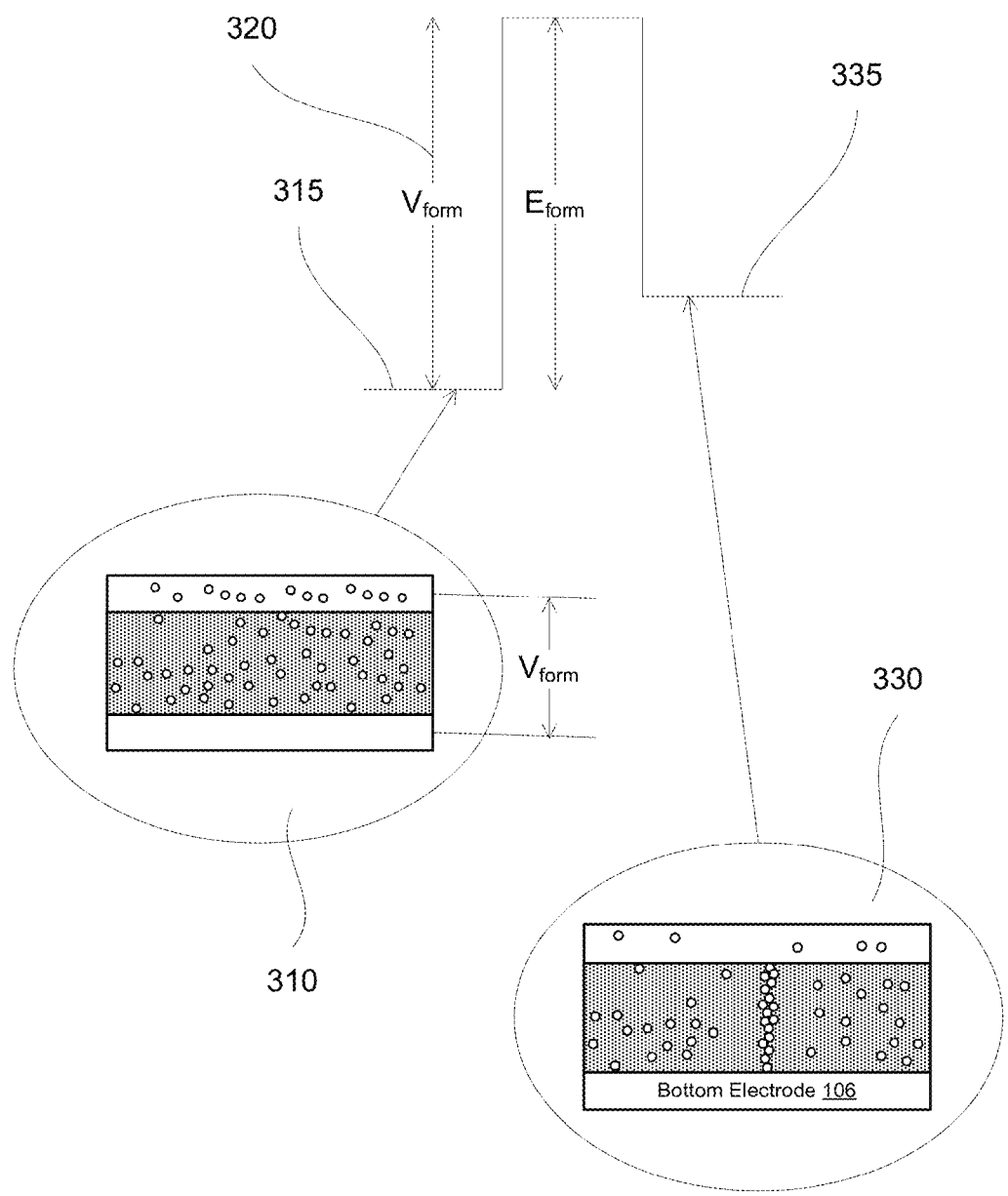
FIG. 3 illustrates a schematic of the forming operation of the switching layer according to some embodiments.

FIG. 3 illustrates a schematic of the forming operation of the switching layer according to some embodiments. The explanation serves as an illustration, and does not mean to bind the disclosure to any particular theory. As deposited, the MIM device can include a random distribution of defects 310, thus can have a high resistance. When applying a forming voltage $V_{form}$, the defects can re-arrange 330 to form one or more filaments running from one electrode to the other electrode.

From an energy level view, the randomly distributed defect configuration 310 can be represented by an energy state 315, and the filament distributed defect configuration 330 can be represented by an energy state 335. The two states can be separated by an energy barrier. When the forming voltage $V_{form}$ 320 is applied to the randomly distributed defect configuration 310, enough energy is supplied to the energy state 315 to allow a jump over the barrier to the energy state 335, represented by the filament distributed defect configuration 330. With the high energy barrier represented by the forming voltage $V_{form}$, the filament distributed defect configuration 330 can be stable during the programming, e.g., the application of set and reset voltages to program the memory device, and during the read application.

As mentioned above, the explanation is illustrative. Specific operations of the memory device can depend on the materials, the properties, and the process conditions of the device.

In some embodiments, disclosed are improved methods and devices for forming resistive memory devices. The memory device can be heated to a forming temperature, which is higher than the operating temperature, during the process of forming the switching layer, e.g., during the application of a forming voltage. After fabricating the memory structures, the memory structure can be heated while applying a voltage to form a switching layer from the insulator layer. With the addition of the thermal energy, the forming voltage can be reduced, which can lead to a reduction in power consumption. Alternatively, the thermal energy can increase the probability of overcome high barrier, e.g., allowing the randomly distributed defect configuration of the as-fabricated memory structure to overcome a higher barrier height to reach the filament distributed defect configuration of the formed memory structure. The higher barrier height can improve the retention of the switching layer as compared to a forming process without the added thermal energy.

Figure 4A:
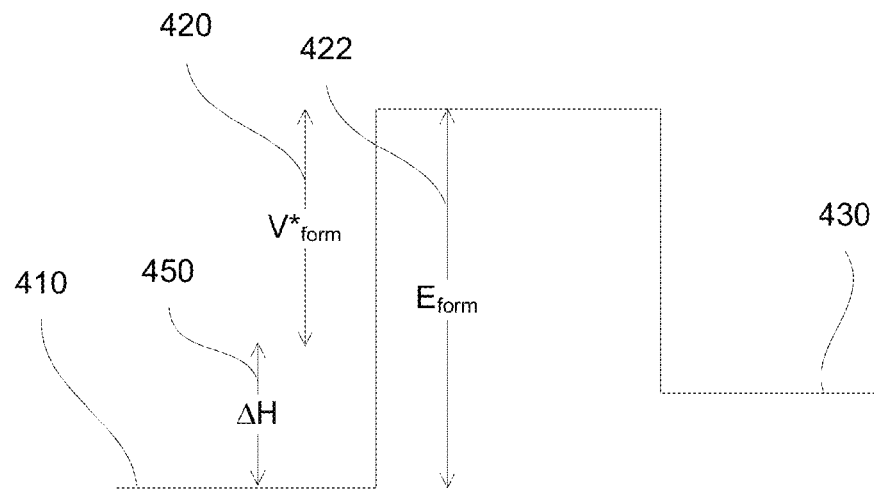
FIGS. 4A-4B illustrate schematics of a forming operation of the switching layer according to some embodiments.
Figure 4B:
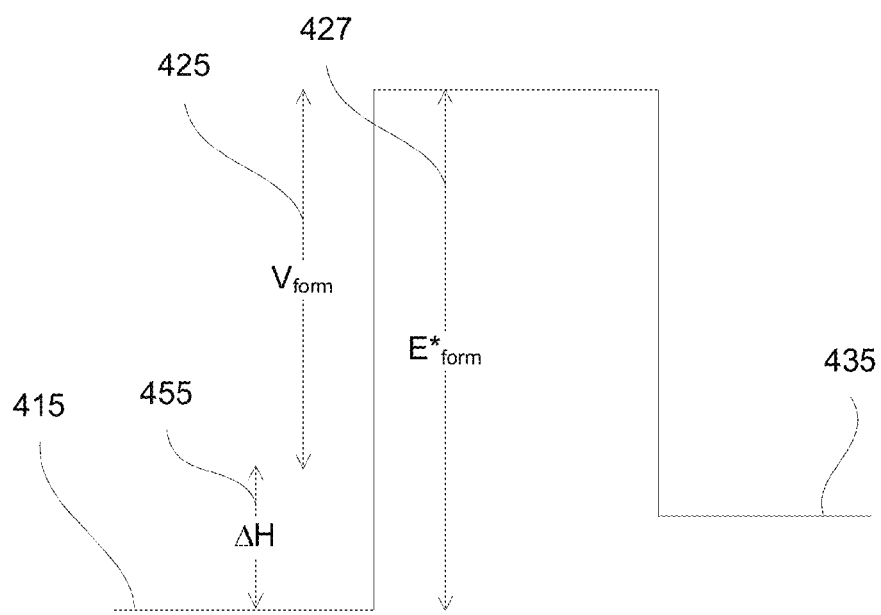

FIGS. 4A-4B illustrate schematics of a forming operation of the switching layer according to some embodiments. In FIG. 4A, a randomly distributed defect configuration can exhibit an energy state 410. A thermal energy $\Delta H$ 450 can be applied to the randomly distributed defect configuration, together with a reduced forming voltage $V^*_{form}$ 420, a lower voltage than the previous mentioned $V_{form}$ 320 but still achieve the same energy barrier height $E_{form}$ 422. With the applied energy $E_{form}$ 422, the randomly distributed defect state 410 can transition to the filament distributed energy state 430. The added thermal energy $\Delta H$ 450 can assist in reducing the forming voltage while still maintaining the quality of the memory devices.

In FIG. 4B, a randomly distributed defect configuration can exhibit an energy state 415. A thermal energy $\Delta H$ 455 can be applied to the randomly distributed defect configuration, together with a forming voltage $V_{form}$ 422, for example, a similar voltage as the previous mentioned $V_{form}$ 320. Due to the added thermal energy, the energy barrier height $E^*_{form}$ 427 that a defect can overcome can be significantly increased, for example, higher than the previous $E_{form}$ 422 by the thermal energy $\Delta H$ 455. With the applied energy $E^*_{form}$ 427, the randomly distributed defect state 415 can transition to the filament distributed energy state 435, overcoming a higher energy barrier height. The added thermal energy $\Delta H$ 450 can assist in providing a more stable filament distributed energy state 435 while still maintaining a similar forming voltage.

Other configurations can be used, such as a forming voltage value between the reduced forming voltage $V^*_{form}$ 420 and the forming voltage $V_{form}$ 425.

In some embodiments, the operating temperature of the memory devices is less than 85 C, such as between a room temperature of 20 C and 85 C, or between 50 and 85 C. The forming temperature can be higher than the operating temperature, up to about 200 C higher, such as between 100 and 200 C higher, or between 50 and 200 C higher. In some embodiments, the forming temperature can be higher than the operating temperature, and can be between 50 C and 250 C.

In some embodiments, a metal-insulator-metal (MIM) structure is used for memory device applications. The MIM structure can then be subjected to a forming temperature and a forming voltage to form the switching layer.

Figure 5A:
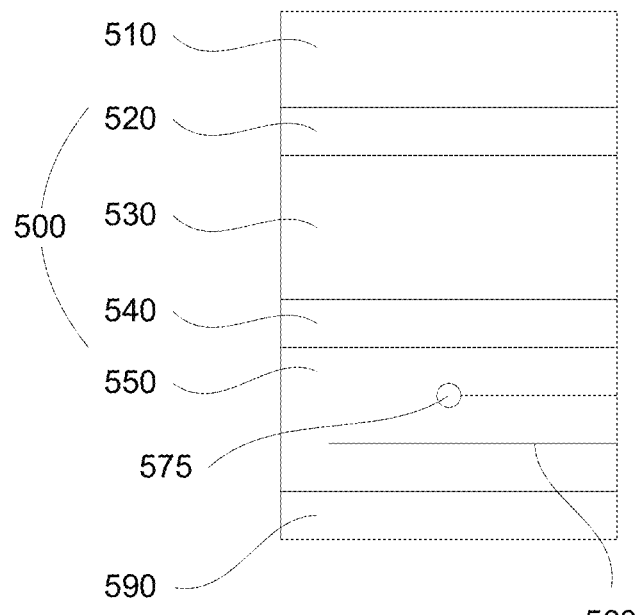
FIGS. 5A-5B illustrate an example of a memory structure according to some embodiments.
Figure 5B:
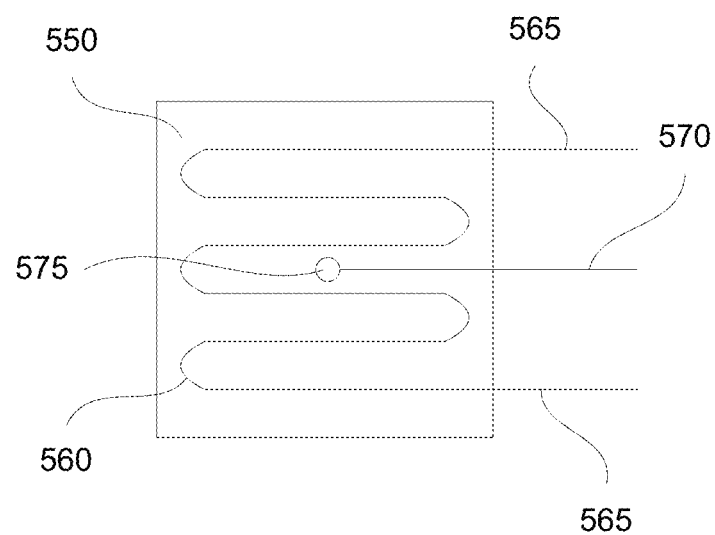

FIGS. 5A-5B illustrate an example of a memory structure according to some embodiments. In FIG. 5A, a cross section view of a memory structure is shown, including a memory device 500 disposed on a substrate 590. The memory device can include a top electrode 520 disposed on an insulator layer 530 disposed on a bottom electrode 540. Other layers can be included, such as a current selector or a current limiter layer 510. As shown, the top electrode 520 is disposed near the insulator layer 530. However, other configurations can be used, such as the top electrode 520 can be disposed on the current selector or current limiter layer 510.

A resistive heater 560 can be disposed on the substrate 590 for heating the memory structure, together with a temperature sensor 575 for measuring the temperature of the memory structure. The resistive heater and the temperature sensor can be embedded in a thermal conductive layer 550.

In FIG. 5B, a top view of the memory structure is shown, including a resistive heater 560 disposed in a thermal conductive layer 550. Leads 565 can be used to provide a voltage or current to heat the heater 560. As shown, the temperature sensor 575 is disposed in the thermal conductive layer 550. However, the temperature sensor 575 can also be placed at or near the memory device 500. Lead 570 can be used to measure the temperature of the temperature sensor 575. The temperature sensor can include a resistor or a diode, which can exhibit different current values for a constant applied voltage based on the surrounding temperature. For example, a voltage can be applied to lead 570, and a current is also measured at lead 570. A look-up table relating the measured current with temperature can be used to determine the temperature of the memory structure.

In some embodiments, the insulator layer can include a layer of $TiO_2$, $HfO_2$, $ZnO_2$, strontium titanate (STO), indium gallium zinc oxide (IGZO), or $SnO_2$. The dielectric layer can include a transition metal oxide. The thickness of the dielectric layer can be between 5 and 25 nm. The electrodes can include Pt, Ru, Ti, TiN, Ag, Ni, Co, an alloy of these elements, or a conductive metal oxide of these elements. The two electrodes can have same composition elements, e.g., both electrodes can include Pt, or can have different composition elements, e.g., one electrode can include Pt and the other electrode Ru. The electrodes can have any thickness, such as between 5 and 500 nm.

In some embodiments, the temperature of the memory structure can be raised to a temperature well above the operating temperature. A forming voltage can then be applied to the memory structure to form the switching layer, for example, by forming defect filaments in the insulator layer. The high temperature of the switching layer forming process can reduce the forming voltage, or can create a defect distribution that allows for lower switching voltages or allows for higher stability or retention.

In some embodiments, the forming temperature can be 200 C higher than the operating temperature. Alternatively, the forming temperature can be less than 50 C higher, less than 100 C higher, or less than 150 C higher. The operating temperature of the memory structure can be less than about 85 C, such as between a room temperature of 20 C and 85 C, or between 50 C and 85 C. Thus the forming temperature can be between 50 C and 300 C, such as between 100 C and 250 C.

Figure 6:
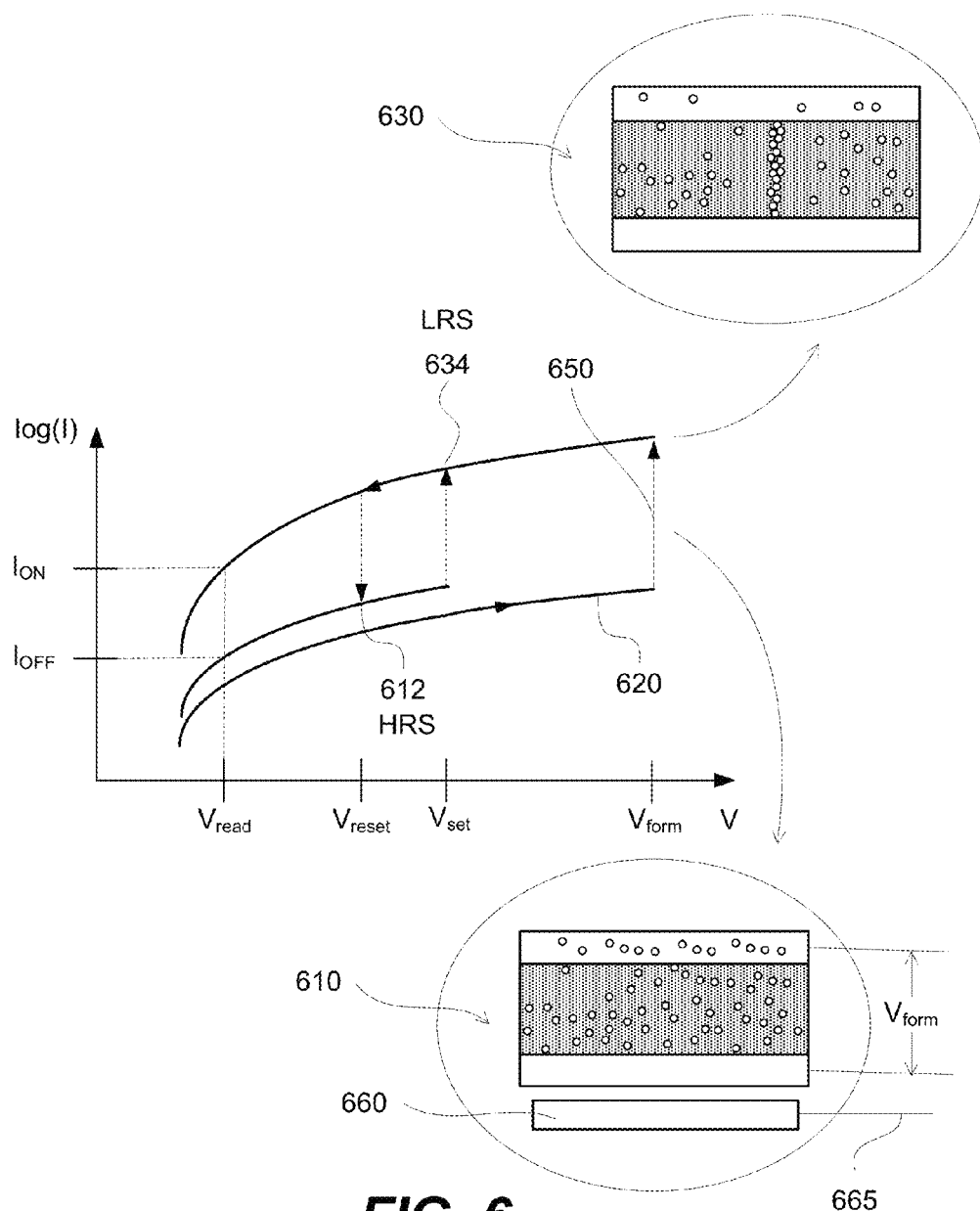
FIG. 6 illustrates a schematic temperature and voltage formation of a unipolar ReRAM cell according to some embodiments.

FIG. 6 illustrates a schematic temperature and voltage formation of a unipolar ReRAM cell according to some embodiments. A MIM structure 610 can be first fabricated with an amount of defects embedded in the insulator layer. A voltage or current 665 can be applied to a resistive heater 660 to heat the MIM structure 610 to a forming temperature. A voltage 620 can be applied to the MIM structure to form a resistive memory device from the MIM structure, for example, by making the insulator layer becoming a switching layer. By applying a forming voltage $V_{form}$, the randomly distributed defects can be transitioned 650 to lower resistance configurations, for example, in the form of filaments 630. After forming, the ReRAM cell may be switched back and forth between its LRS 634 and HRS 612.

The addition of the high forming temperature can significantly change the behavior of the insulator layer during the application of the forming voltage. For example, higher defect formation and more stable defect distribution can be achieved with lower forming voltage during the high forming temperature application.

Figure 7:
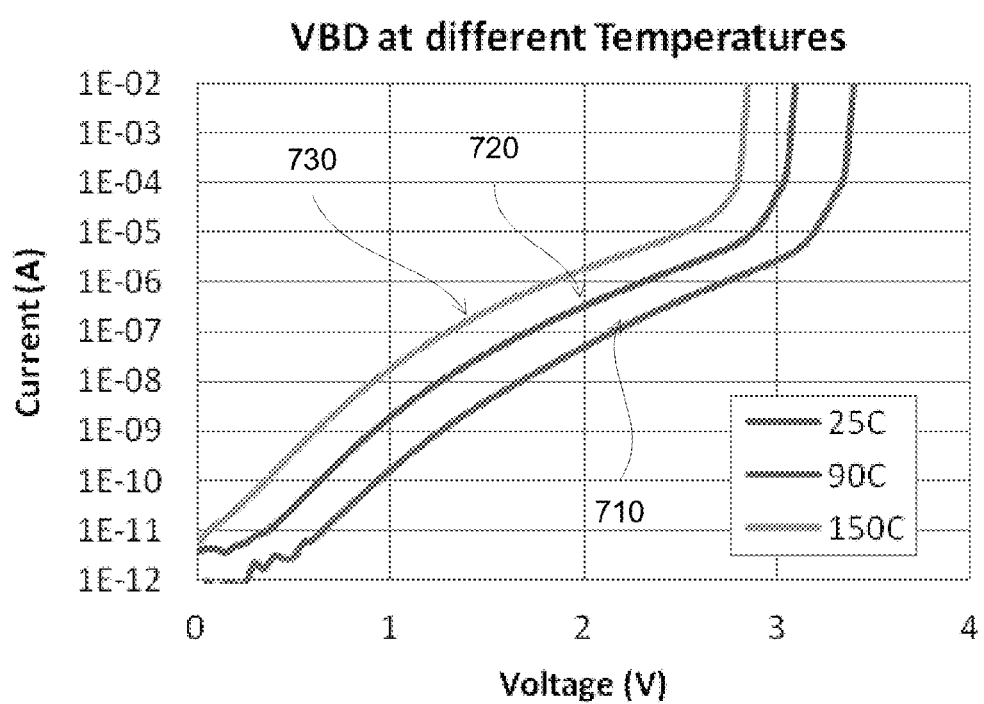
FIG. 7 illustrates I-V curves for an insulator layer of a memory structure according to some embodiments.

FIG. 7 illustrates I-V curves for an insulator layer of a memory structure according to some embodiments. I-V curves 710, 720, and 730 until breakdown for different temperatures 25C, 90C, and 150C, respectively, are shown. Higher temperatures can lead to higher currents and lower breakdown voltage, indicating higher defect formation in the insulator layer.

In some embodiments, methods and memory chips are provided including applying a forming voltage at a high forming temperature for forming the memory devices.

Figure 8:
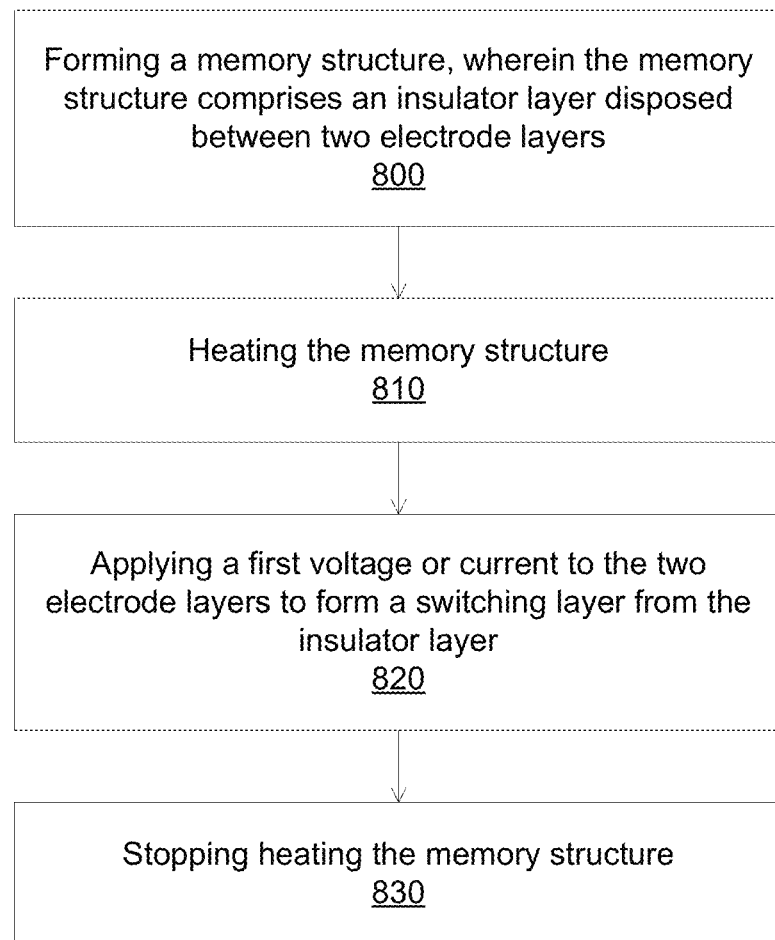
FIG. 8 illustrates a flowchart for forming a memory device according to some embodiments.

FIG. 8 illustrates a flowchart for forming a memory device according to some embodiments. The described flowchart is a general description of techniques used to form the memory devices described above. The flowchart describes techniques for forming a memory device generally including two electrodes and one or more layers disposed there between. Although certain processing techniques and specifications are described, it is understood that various other techniques and modifications of the techniques described herein may also be used.

In operation 800, a memory structure is formed. The memory structure can include an insulator or dielectric layer disposed between two electrodes. For example, a first electrode layer can first be formed. The first electrode layer can be formed on a substrate, for example, a silicon substrate that may include one or more layers already formed thereon. In some embodiments, the first electrode layer can be a polysilicon layer or a metal containing layer. For example, the first electrode layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first electrode layer may be provided on a substrate that may have a resistive memory element and the electrode formed thereon as well. Alternatively, in the case where no other device is provided, the first electrode layer can be the bottom electrode. The first electrode layer can include TiN, TaN, Ni, Pt, or Ru. Other elements can also be used, such as Ti, Al, MoO$_2$, W, poly-Si, TiSiN, TaSiN, or any combination, mixture or alloy thereof that can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), physical vapor deposition (PVD), CVD, evaporation, etc. can also be used to deposit the first electrode. In some embodiments, the first electrode is in contact with one of the signal lines. The first electrode may have any thickness, for example between about 5 nm and about 500 nm thick.

After depositing the first electrode layer, an insulator or dielectric layer can be formed on the first electrode. The insulator layer can be operable as a switching layer after subjected to a forming process. The insulator layer can include ZrO$_2$, HfO$_2$, or Al$_2$O$_3$. The thickness of the insulator layer can be between 3 nm and 30 nm. An optional treatment can be performed after depositing the insulator layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the insulator layer can be deposited by a PVD or ALD process. For example, an ALD process can include O$_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

After depositing the insulator layer, a second electrode layer is formed on the stack. The second electrode layer can include TiN, TaN, Ni, Pt, or Ru. Other elements can also be used, such as Ti, Al, MoO$_2$, W, poly-Si, TiSiN, TaSiN, or any combination, mixture or alloy thereof that can be formed using PVD or other processes. The second electrode can have any thickness, for example between about 5 nm and about 500 nm thick. Additional layers can be added, such as layers for a current selector or a current limiter device.

In operation 810, the memory structure is heated, for example, to a forming temperature that is above or well above an intended operating temperature of the memory device. The memory structure can be heated by an external heater or can be heated by an embedded heater within the memory device. For example, before or after depositing the memory structure, a resistive heater layer can be deposited, which, when a current is passed through, can be heated. An insulator layer can be deposited between the resistive heater layer and the memory structure to electrically isolate the two components.

In some embodiments, the forming temperature can be up to 200 C higher than the operating temperature. The operating temperature of the memory structure can be less than about 85 C. Also, the forming temperature can be between 50 C and 300 C.

In some embodiments, the temperature of the memory structure can reach the forming temperature before the process proceeds to the next step. A temperature sensor, such as an external thermocouple or an embedded diode or resistance temperature sensor, can be used to monitor the temperature of the memory structure. The temperature sensor can be located at or near the memory structure, can be located at or near the resistive heater element, or can be located at any location representative of the temperature of the memory structure.

For example, after depositing the resistive heater layer, a temperature-dependent resistive layer can be deposited before depositing the memory structure. The temperature-dependent resistive layer can be used to obtain the temperature of the memory structure, for example, by measuring the resistance of the temperature-dependent resistive layer. A correlation between the resistance and the temperature of the temperature-dependent resistive layer can be used to extract the temperature from the resistance. Insulator layers can be deposited between the resistive heater layer and the temperature-dependent resistive layer, and between the temperature-dependent resistive layer and the memory structure to electrically isolate each of these two components.

Other configurations can also be used, such as a temperature sensor on the memory structure on the heater element, or the memory structure on the heater element on the temperature sensor. Also, the temperature sensor can include a diode or other sensor devices.

In operation 820, a forming voltage is applied to the two electrodes of the memory structure. The forming voltage can form a switching layer from the insulator layer, for example, by re-arrange the defect distribution in the insulator layer, such as from a randomly distributed defect configuration to a filament distributed defect formation. The forming voltage can be less than 90% of the breakdown voltage of the insulator layer at the forming temperature, such as less than 85%, 80%, or 75%.

In some embodiments, the forming voltage can be applied after the memory temperature reaches the forming temperature, as measured by the temperature sensor.

In operation 830, the application of the forming voltage and the heating can be stopped.

In some embodiments, the ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 9:
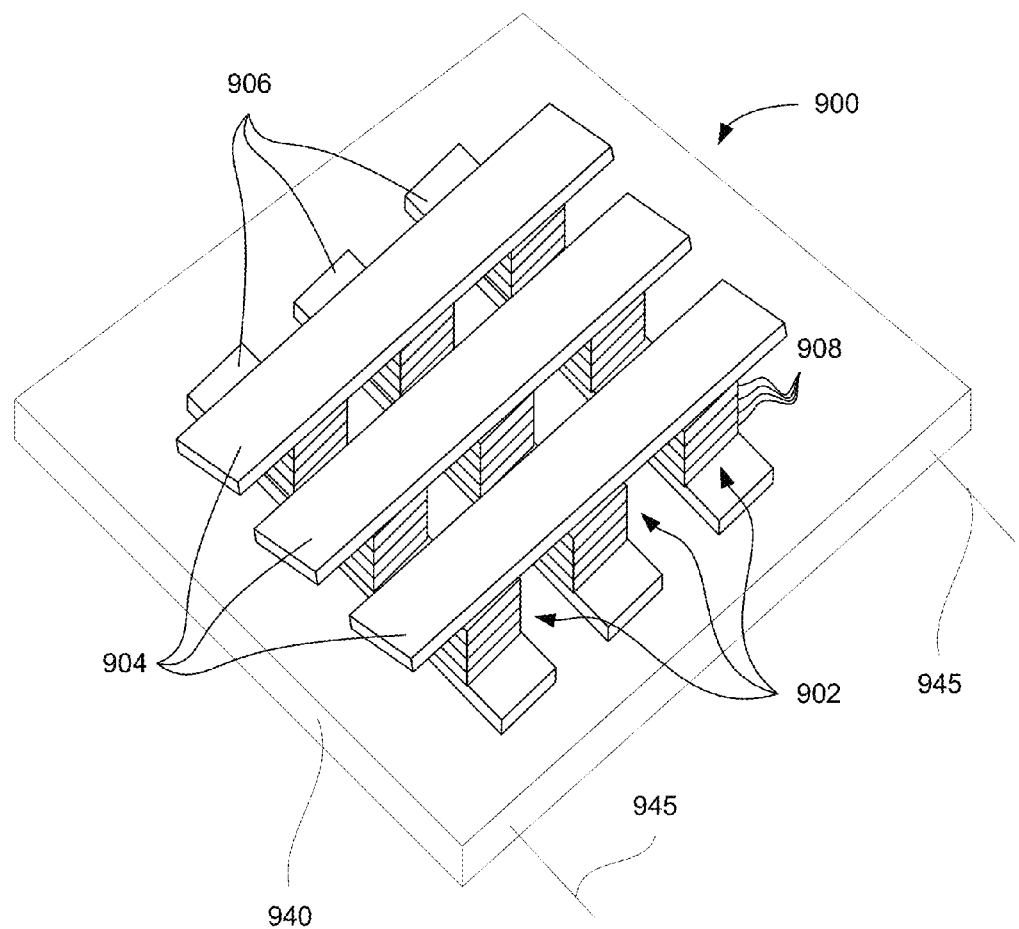
FIG. 9 illustrates a memory array of resistive switching memory elements according to some embodiments.

FIG. 9 illustrates a memory array of resistive switching memory elements according to some embodiments. Memory array 900 may be part of a memory device or other integrated circuit. Memory array 900 is an example of potential memory configurations; it is understood that several other configurations are possible.

Read and write circuitry may be connected to memory elements 902 using signal lines 904 and orthogonal signal lines 906. Signal lines such as signal lines 904 and signal lines 906 are sometimes referred to as word lines and bit lines and are used to read and write data into the elements 902 of array 900. Also, signal lines 904 and 906 can be used to apply forming voltage to the memory structures 902. Individual memory elements 902 or groups of memory elements 902 can be addressed using appropriate sets of signal lines 904 and 906. Memory element 902 may be formed from one or more layers 908 of materials, as is described in further detail below. In addition, the memory arrays shown can be stacked in a vertical fashion to make multi-layer 9-D memory arrays.

Any suitable read and write circuitry and array layout scheme may be used to construct a non-volatile memory device from resistive switching memory elements such as element 902. For example, horizontal and vertical lines 904 and 906 may be connected directly to the terminals of resistive switching memory elements 902. This is merely illustrative.

During the operation of the cross point memory array, such as a read operation, the state of a memory element 902 can be sensed by applying a sensing voltage (i.e., a "read" voltage) to an appropriate set of signal lines 904 and 906. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 904 and 906.

In some embodiments, a resistive heater layer 940 can be provided near the cross point memory array 900, for example, to heat the cross point memory array 900 to a forming temperature before applying a forming voltage. Heater leads 945 can be used to supply a voltage or current to the resistive heater 940.

In some embodiments, the memory elements 902 can include a memory structure and a current selector or a current limiter. For example, the current selector can be fabricated on the memory structure, forming a columnar memory device, which can be placed at the cross points of the word lines and bit lines.

Figure 10A:
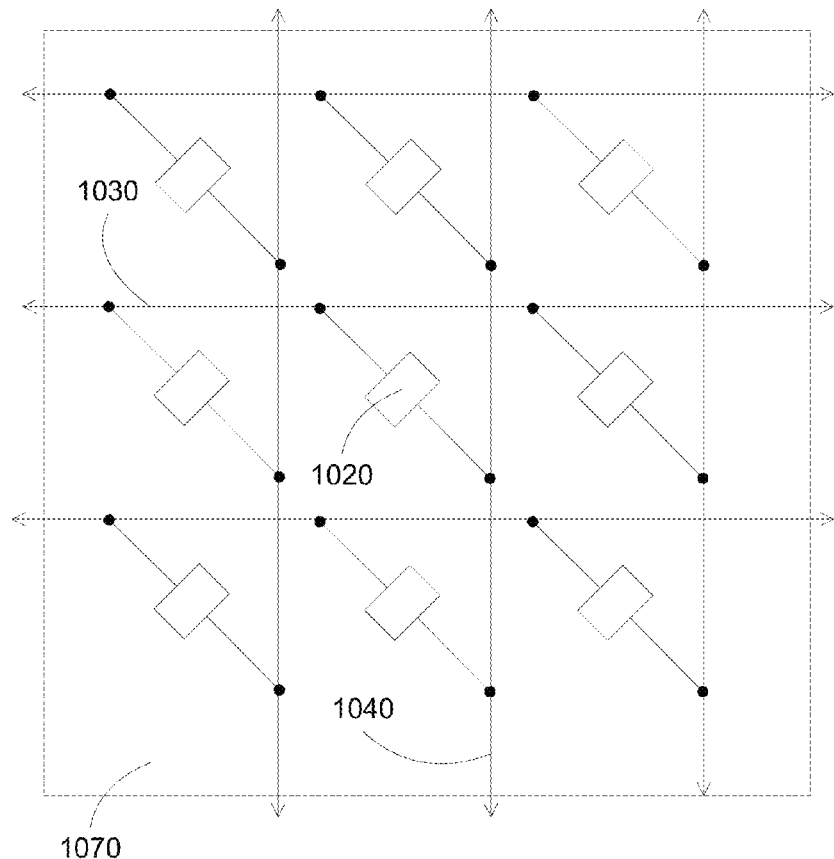
FIGS. 10A-10B illustrate a cross point memory array according to some embodiments.
Figure 10B:
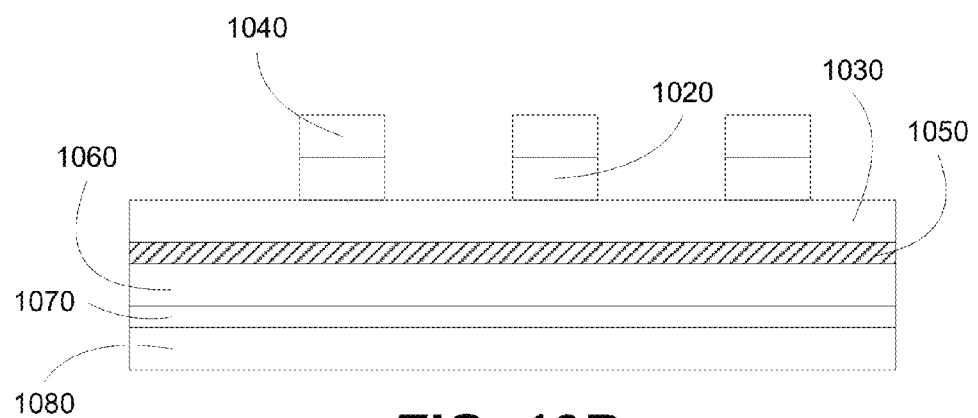

FIGS. 10A-10B illustrate a cross point memory array according to some embodiments. FIG. 10A shows a schematic and FIG. 10B shows a cross section view of the cross point memory array. A switching memory device can include a memory element and a current selector 1020, which are both disposed between the electrodes 1030 and 1040. The current selector can be an intervening electrical component, disposed between electrode 1030 and memory element, or between the electrode 1040 and memory element 1020. In some embodiments, the current selector may include two or more layers of materials that are configured to provide a selector response.

A heater element 1070 can be included in the cross point memory array, for example, to heat the memory elements to a forming temperature. The heater element 1070 can be placed on a substrate 1080, and can be isolated from the cross point memory array be an insulating layer 1060.

In some embodiments, the high temperature forming process can be performed at chip level, e.g., after packaging. After the memory structures are fabricated, e.g., the electrodes and the insulator layer are deposited, on a semiconductor wafer, the wafer is diced into individual memory arrays. The memory arrays are then encapsulated to form memory chips. Embedded heater in the memory chips can allow heating the memory chip while forming the switching layers.

Figure 11:
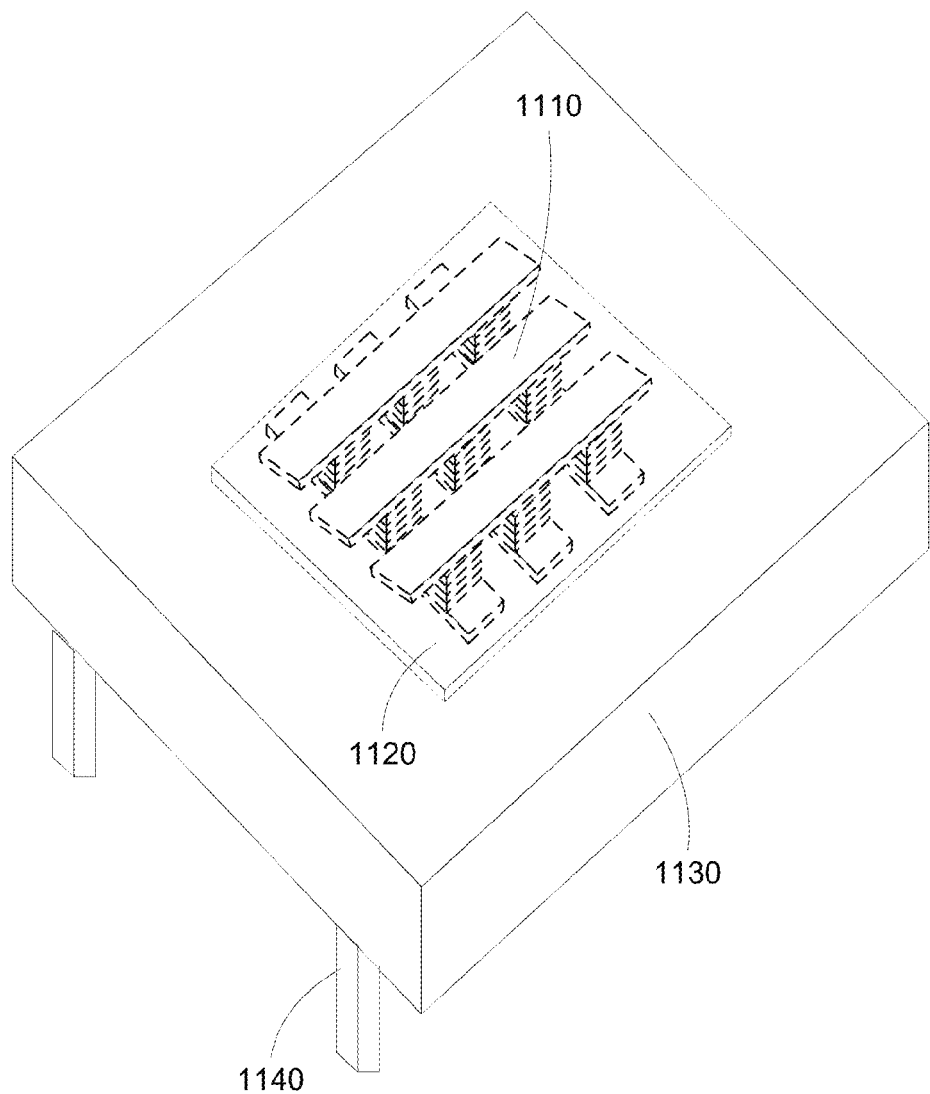
FIG. 11 illustrates a memory chip having an embedded heater element according to some embodiments.

FIG. 11 illustrates a memory chip having an embedded heater element according to some embodiments. A memory array 1110 and a heater element 1120 can be encapsulated in a memory chip package 1130. Bond pads or lead pins 1140 can be used supply current to the heater element to heat the memory array. The lead pins 1140 can also be used to monitor the temperature of the memory array. The lead pins can also be used to provide forming voltages, reading voltages, set voltages, and reset voltages.

In some embodiments, methods to form memory chips with both forming temperature and voltage/current can be provided. The methods can include forming a memory chip with an embedded heater and temperature sensor. The memory chip is then heated to a forming temperature before a forming voltage is applied to form switching elements in the memory array.

Figure 12:
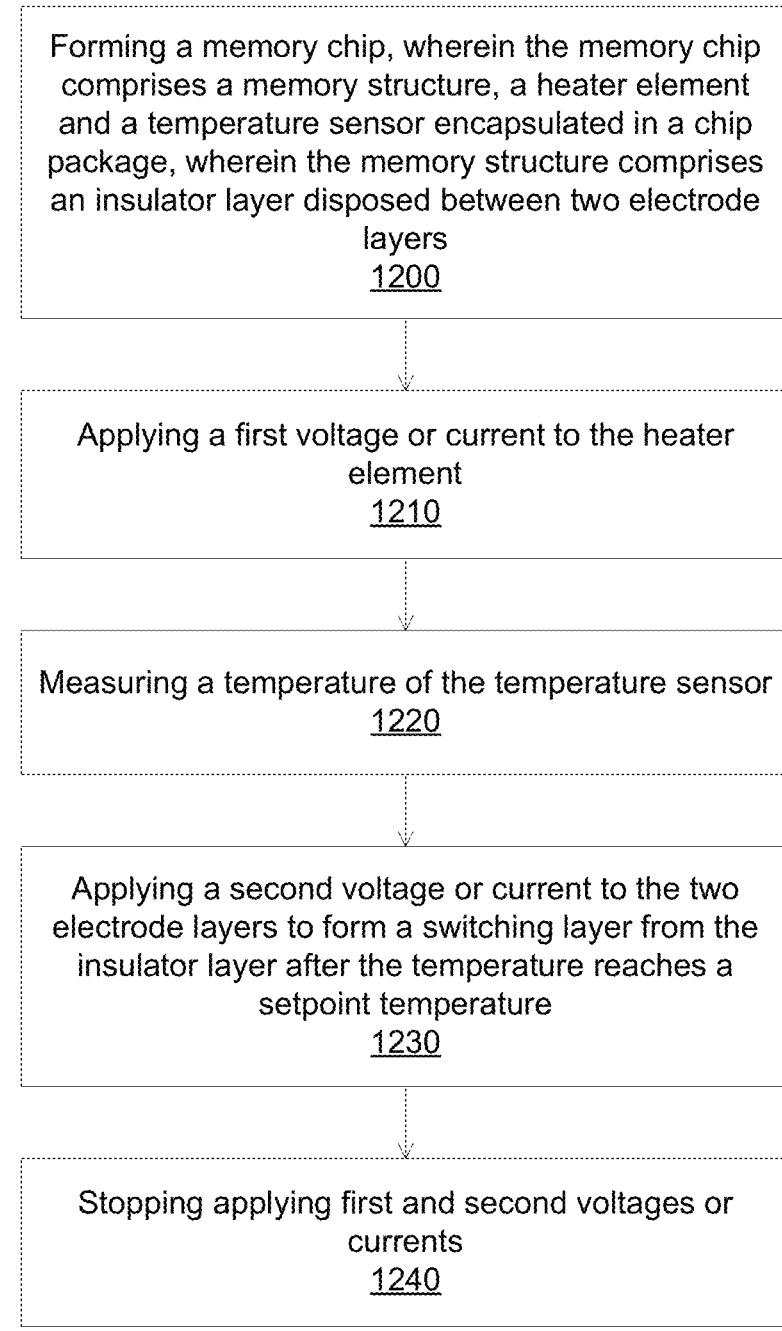
FIG. 12 illustrates a flowchart for forming a memory chip according to some embodiments.

FIG. 12 illustrates a flowchart for forming a memory chip according to some embodiments. In operation 1200, a memory chip is formed. The memory chip can include a memory array, such as a cross point memory array, which includes multiple memory structures. The memory structure can include an insulator layer disposed between two electrode layers. The memory chip can also include a heater element and a temperature sensor. The memory chip can be encapsulated in a chip package, with lead pins or bond pads for external connections.

In operation 1210, a heating voltage or current is applied to the heater element to heat the memory array. In operation

1220, the temperature of the memory chip is measured. In operation 1230, a forming voltage is applied to the memory structures to form switching elements from the insulator layers. In some embodiments, the forming voltage is applied after the measured temperature reaches a setpoint temperature. In operation 1240, the forming voltage and the heating voltage or current are terminated.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising
   forming a memory structure, wherein the memory structure comprises an insulator layer disposed between two electrode layers;
   heating the memory structure to a temperature higher than an operating temperature of the memory structure;
   applying a first voltage to the two electrode layers to form a switching layer from the insulator layer;
   stopping heating the memory structure.

2. A method as in claim 1 wherein the operating temperature is less than 85° C., wherein the forming temperature is between 85° C. and 200° C.

3. A method as in claim 1 wherein heating the memory structure comprises applying a second voltage or current to a heater, wherein the heater is disposed in a vicinity of the memory structure.

4. A method as in claim 1 further comprising
   monitoring the temperature of the memory structure after heating.

5. A method as in claim 1 wherein forming a switching layer from the insulator layer comprises forming a filament in the insulator layer.

6. A method comprising
   forming a memory chip, wherein the memory chip comprises a memory structure, a heater element and a temperature sensor encapsulated in a chip package, wherein the memory structure comprises an insulator layer disposed between two electrode layers;
   applying a first current to the heater element to heat the memory structure to a temperature higher than an operating temperature of the memory structure;
   measuring a temperature of the temperature sensor;
   applying a second voltage to the two electrode layers to form a switching layer from the insulator layer after the temperature reaches a setpoint temperature;
   stopping applying the first current and the second voltage.

7. A method as in claim 6 wherein the memory structure is heated to 100° C. higher than the operating temperature of the memory structure.

8. A method as in claim 6 wherein the operating temperature is less than 85° C., wherein the memory structure is heated to a temperature less than 200° C.

9. A method as in claim 6 wherein heating the memory structure comprises applying a voltage or current to a heater, wherein the heater is disposed in a vicinity of the memory structure.

10. A method as in claim 6 further comprising
    monitoring the temperature of the memory structure after heating.

11. A method as in claim 6 wherein forming a switching layer from the insulator layer comprises forming a filament in the insulator layer.

12. A method as in claim 6 wherein the memory structure comprises an array of memory devices, wherein a memory device comprises a switching element disposed between two electrode layers.

13. A method as in claim 12 wherein heating the memory structure comprises heating the array of memory devices.

14. A method as in claim 6 wherein the memory chip is encapsulated with external contact pins.

15. A method as in claim 14 wherein the first current or the second voltage is applied to the memory chip through the external contact pins.

* * * * *